United States Patent
Fazzina

(10) Patent No.: US 7,109,700 B2
(45) Date of Patent: Sep. 19, 2006

(54) MULTIMETER HAVING OFF-DEVICE DISPLAY DEVICE AND SELECTION DEVICE

(76) Inventor: David Fazzina, 12208 W. Dorado Pl., #206, Littleton, CO (US) 80127

(*) Notice: Subject to any disclaimer, the term of this patent is extended or adjusted under 35 U.S.C. 154(b) by 3 days.

(21) Appl. No.: 10/855,308

(22) Filed: May 26, 2004

(65) Prior Publication Data
US 2004/0239308 A1 Dec. 2, 2004

Related U.S. Application Data

(60) Provisional application No. 60/474,450, filed on May 30, 2003.

(51) Int. Cl.
 *G01R 15/08* (2006.01)
 *G01R 31/02* (2006.01)
(52) U.S. Cl. .................. 324/115; 324/754; 324/761
(58) Field of Classification Search ............... None
 See application file for complete search history.

(56) References Cited

U.S. PATENT DOCUMENTS 5,532,581 A * 7/1996 Ohkura et al. ............. 324/115
5,621,311 A    4/1997 Kamiya
6,043,640 A    3/2000 Lauby et al.
D428,349 S     7/2000 Pagliara
6,118,270 A *  9/2000 Singer et al. ............ 324/117 R
6,218,824 B1   4/2001 Oldstead et al.
2003/0137310 A1 * 7/2003 Holzel ....................... 324/537

* cited by examiner

Primary Examiner—Minh N. Tang
(74) Attorney, Agent, or Firm—Blakely, Sokoloff, Taylor & Zafman LLP

(57) ABSTRACT

Electronic testing devices such as multimeters, and probes therefor. The probes may have off-device display devices attached thereto. The display devices may be non-detachably attached to the probes. In an aspect, conductive pathways to carry probe signals and display signals may be run in parallel or be integrated and may be coupled with a common port or hole of the electronic testing device. In an aspect, a hinge may be used to attach the display devices to the probes. In an aspect, the display device may be attached to a side of the probe to facilitate viewing of the display by a user.

25 Claims, 11 Drawing Sheets

Autoranging multimeter

MULTIMETER HAVING OFF-DEVICE DISPLAY DEVICE AND SELECTION DEVICE

RELATED APPLICATIONS

The present application claims priority benefit under Title 35, United States Code, Section 119(e), as well as under any other relevant sections, to U.S. Provisional Patent Application Ser. No. 60/474,450, entitled "MULTIMETER HAVING OFF-DEVICE DISPLAY DEVICE AND SELECTION DEVICE", which was filed on May 30, 2003.

BACKGROUND

1. Field

An embodiment of the invention relates to an electronic test instrument. More particularly the embodiment relates to a multimeter.

2. Background Information

Various multimeters, their properties, and their uses have been discussed in the literature. FIG. 1 shows an exemplary digital multimeter. The digital multimeter has a digital display screen on the main device. Coupled with the multimeter are red and black colored probes, shown here in different grayscale, that a user may use to test an electrical system. In a representative method of use, a user may contact terminal portions of the probes with an electrical system under test and read test results from the digital display screen on the main device.

One potential problem that the inventor has recognized is that the display screen may be inaccessible for viewing when the user is handling the probes. This may be particularly true when the main device portion of the multimeter is placed on a surface or attached to the user (e.g., clamped to a belt).

Another potential problem that the inventor has recognized is that the user may divert his attention away from the probes while trying to read results from the digital display screen and may unintentionally move the terminal portions of the probes. This may lead to an erroneous measurement or potential damage of the multimeter if the probe contacts a high voltage or current line. More importantly this may potentially place the user in danger.

BRIEF DESCRIPTION OF THE SEVERAL VIEWS OF THE DRAWINGS

The invention may best be understood by referring to the following description and accompanying drawings that are used to illustrate embodiments of the invention. In the drawings.

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure the understanding of this description.

A meter is a measuring instrument. An ammeter measures current. A voltmeter measures the potential difference (voltage) between two points. An ohmmeter measures resistance. A multimeter combines these measurement functions into a common instrument and may potentially include additional measurement functions.

Multimeters are widely used and are well known in the arts. Further background information on multimeters is available in the book Digital Multimeter Principals, 2nd edition (January 2001), by Glen A. Mazur, published by Amer Technical Pub, ISBN: 0826914985. Still further background information is available in U.S. Pat. Nos. 6,043,640 and 5,621,311. These three references are hereby entirely incorporated herein by this reference.

Figure 1:
FIG. 1 shows an exemplary digital multimeter.
Figure 2:
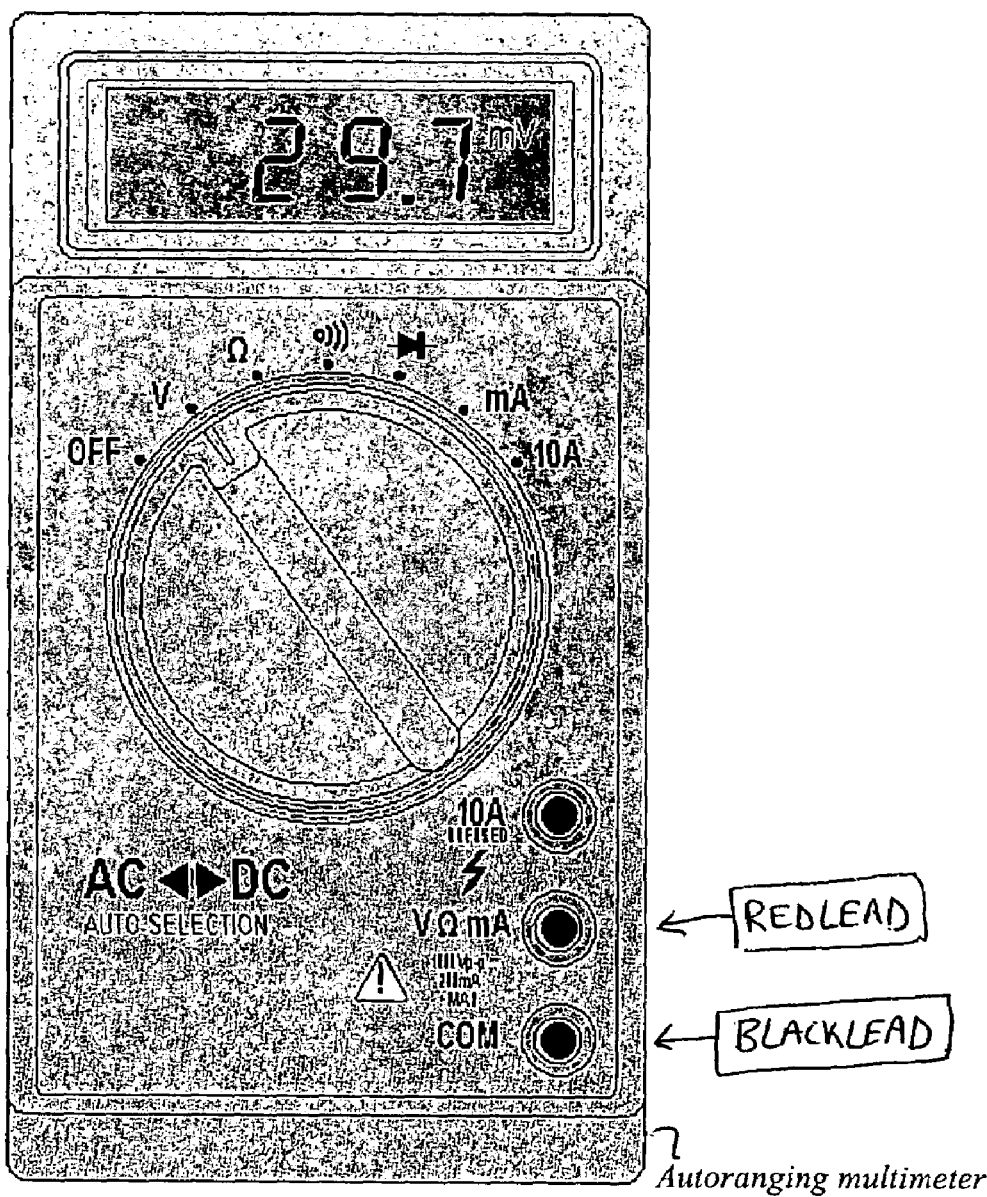
FIG. 2 shows an autoranging multimeter suitable for one embodiment of the invention.
Figure 3:
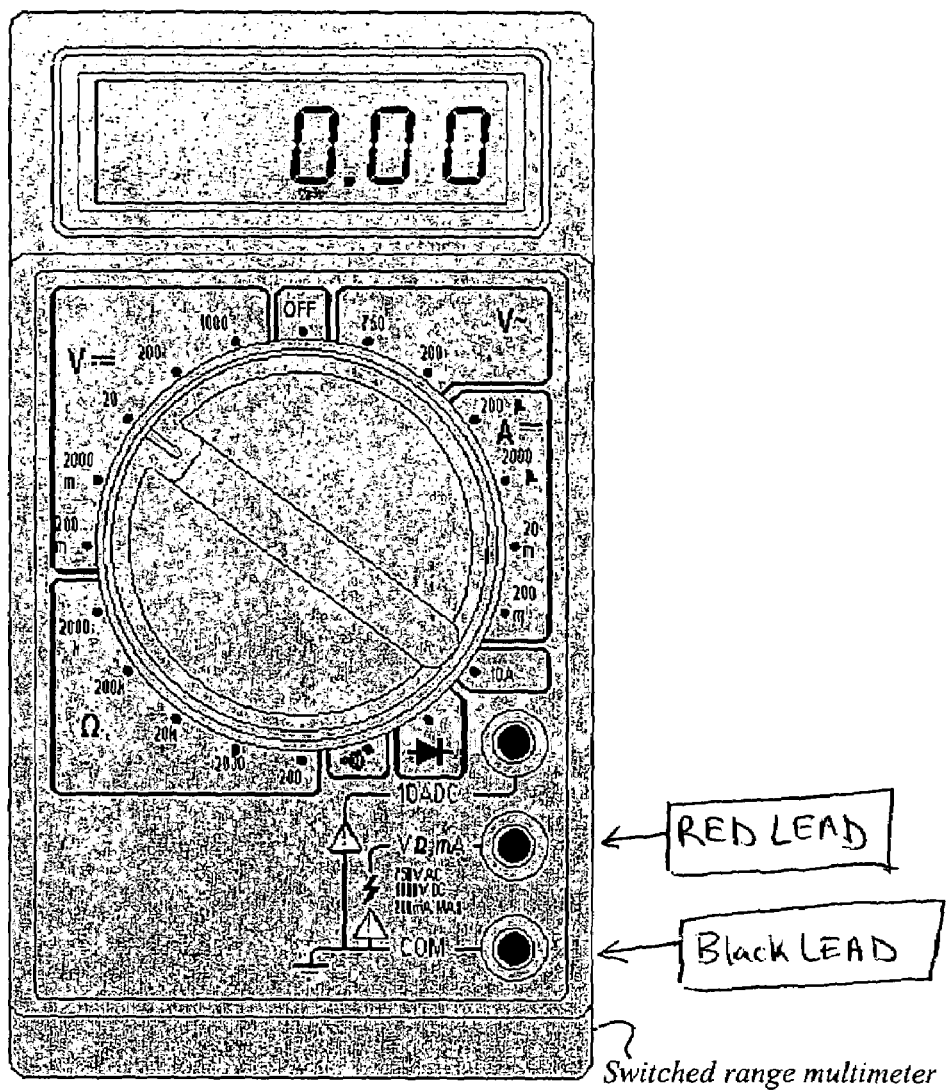
FIG. 3 shows a switched range multimeter suitable for one embodiment of the invention.

There are different types of multimeters. FIG. 2 shows an autoranging multimeter suitable for one embodiment of the invention. FIG. 3 shows a switched range multimeter suitable for one embodiment of the invention. An embodiment of the invention is applicable to both types of multimeters, as well as other types known in the arts.

I. Off-Multimeter Display Device

A potential problem with conventional multimeters used for electrical measurements is that it may be cumbersome to handle the multimeter, and the one or more probes, and at the same time read measurement information from the display located on the main device housing of the multimeter. Some users may attempt to balance the multimeter on the end of their hands, or hold both the multimeter and the probe. The user may look away from the panel, circuit, or other electrical system under test, to view the display on the multimeter. While looking away an accidental misconnection may be made due to the distraction the user experiences in looking away from his hands to find and read the display. In the misconnection the probe may be contacted with a wrong circuit, line, or other portion of the electrical system under test. For example, the user may accidentally touch a probe to a high voltage, amperage, or power connection, as he looks away to view the display on the main device. The misconnection may result in an erroneous measurement. The misconnection may also potentially damage the multimeter. More importantly, the misconnection may potentially place the user in danger. For example, in a scenario when a user is using the multimeter to read an electrical panel, for example at an industrial facility, there is a need for safety sakes to maintain full attention to what your hands are doing without needing to look away to read data from the display on the multimeter.

A testing device, according to one embodiment of the invention, includes a multimeter in which an off-multimeter display device may be located and attached proximate a terminal portion of a probe. Suitable off-multimeter display devices include but are not limited to digital displays, light emitting diode (LED) displays, liquid crystal displays (LCDs), analog displays, displays including a moveable needle and a fixed scale, and other display devices known in the arts. In one embodiment of the invention, the display device may be attached to or coupled with a probe near a terminal portion thereof. Suitable probes include but are not limited to those containing crocodile clips, needles, and pins. Other suitable probes include but are not limited to a Fluke PV350 Pressure/Vacuum Module, a Fluke 80PK-3A Surface Probe, a Fluke 80PK-5A Piercing Type-K Probe, a Fluke i410 Current Clamp Multimeter Accessory, a Fluke TL26 60" 5-Way Test Lead Set, each of which is available from Fluke of Everett, Wash. Other probes similar to these Fluke probes are also suitable. Still other suitable probes include a 12" or other extended length extender probe. Yet other suitable probes include a 5000 volt or other high voltage probe.

Suitable approaches to attach the off-device display device to the probe include plastic molding, sonic welding, attachment with a hinge, attachment with a fastener such as an adhesive, glue, clip, clamp, rivots, staples, or attachment with a pivot point, etc. The display device may be attached to a terminal portion of the probe which often has a thickness greater than a centralized wire portion of the probe. Alternatively, the off-device display device may be attached to a flexible wire, cord, or cable portion of the probe proximate a terminal end of the probe. As used herein proximate, as in proximate the terminal portion of the probe used to contact and test an electrical system, means within about 12 inches of the terminal portion. Such a long distance may be appropriate if a wand-like extender probe is employed. Often the display device proximate the terminal probe portion is within about 6 inches or within about 3 inches of the terminal portion of the probe used to contact and test the electrical system.

Figure 4:
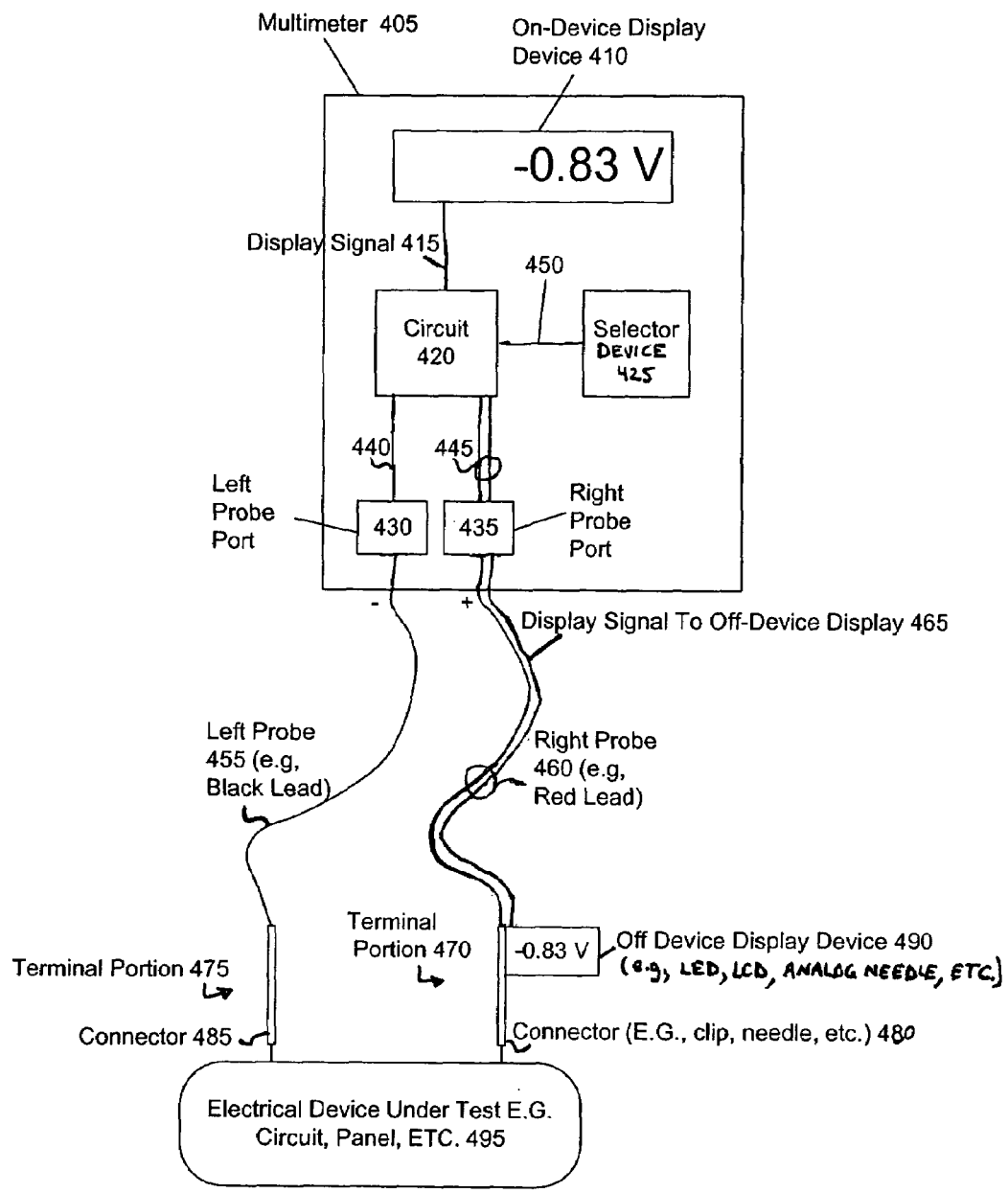
FIG. 4 shows a system including a multimeter, a left probe (e.g., a black lead), a right probe (e.g., a red lead), an off-device display device, and an electrical device under test, according to one embodiment of the invention.

FIG. 4 shows a system including a multimeter 405, a left probe 455 (e.g., a black lead), a right probe 460 (e.g., a red lead), an off-device display device 490, and an electrical device under test 495, according to one embodiment of the invention. As used herein the terms "right" and "left" are used "as viewed" to facilitate description. It will be appreciated that the devices disclosed herein may be used in a variety of orientations including wherein left and right are reversed. The multimeter 405 includes an optional on-device display device 410. Generally the on-device display device 410 will be desired. A circuit 420 is coupled with the on-device display device 410 to in part provide a display signal 415 to the on-device display device 410 based on measurements made with the probes 455, 460. The circuit 420 and the display signal 415 may be conventional as used in conventional multimeters known in the arts.

The multimeter 405 also includes a selector device 425, such as a dial, knob, buttons, switches, or other selector devices known in the arts. The selector device 425 is coupled with the circuit to provide a selection signal 450 to the circuit to affect electrical processing by the circuit. The multimeter 405 also includes a left probe port 430 and a right probe port 435 coupled with the circuit 420 to respectively provide a left probe signal 440 and a right probe signal 445 to the circuit conveying probe measurement data. The probe signals 430, 435 convey measurement information to the circuit 420. The left probe 455 is coupled with the left probe port 430 and the right probe 460 is coupled with the right probe port 435. The probes 455, 460 may include pins, plugs, wires, or other conductors inserted into holes of the respective ports 430, 435. In the illustrated embodiment, a common hole is used for both the probe signal and the off-device display device signal, although this is not required. In an alternate embodiment of the invention, a different hole or connector may be used for the display signal than for the probe signal. A left connector 485 at a terminal portion 475 of the left probe 455 is coupled with a first portion of the electrical device under test 495. The connector 485 may include a needle, pin, crocodile clip, etc. Likewise a right connector 480 at a terminal portion 470 of the right probe 460 is coupled with a second portion of the electrical device under test 495. The device under test may include a circuit, electrical panel, electrical device, battery, car, airplane, etc. The connectors 485, 480 convey signals representing measurement data to their probes that convey the signals to the multimeter 405 and to the circuit 420 which processes the signals and generates the corresponding display signal based on a signal 450 conveying setting information from the selector device 425.

The off-device display device 490 is attached to the right probe 460 at the terminal portion 470 thereof. In particular the off-device display device 490 is attached to the right connector 480. The right connector 480 may represent a rigid or semi-rigid plastic or other typically insulating material housing an electrically conductive needle, pin, or crocodile clips. The display device 490 may be attached to the connector 480 with sonic welding, various fasteners, etc. As discussed above the attachment to the connector is not required but may be appropriate to provide additional support, since other portions of the probe may be more flexible and less rigid.

A display signal 465 is conveyed from the circuit 420 to the off-device display device 490 through the right probe port 435 and right probe 460. The display signal 465 provided to the off-device display device 490 may be the same as, based on, or at least related to the display signal 415 provided to the on-device display device 410. In brief the circuit 420 conventionally has capability to provide the display signal 415 to the on-device display 410. In one embodiment of the invention the display signal 415 to the on-device display device 410 may be sampled or tapped to generate the display signal 465 to the off-device display device 490. The multimeter may contain a wire or other conductive pathway to provide a signal associated with the display signal 415 to the right probe port 435. The right probe 460 may have a wire or other conductive pathway to receive the signal, transmit the signal, and provide the signal to the off-device display device 490.

In one embodiment of the invention, if a format of the off-device display device 490 is different than a format of the on-device display device 410, a format conversion circuit may be provided in the multimeter 405, the right probe 460, or the off-device display device 490, to convert to the format of the off-device display device 490. In an alternate embodiment of the invention the circuit 420 may be adapted to generate the display signal 415 to the on-device display device 410, and the off-device display device 490, in any appropriate format, independently. Such adaptation is well within the skill of those having an ordinary level of skill in the art and the benefit of the present disclosure. Other ways of deriving the display signal 465 from the display signal 415 may also optionally be employed.

In any event the off-device display device 490 may receive the display signal based on conventional processing performed within the circuit 415. In an embodiment of the invention, a separate wire, line, or other conductive pathway may be run parallel to a probe wire from a probe port on the multimeter to the connector 480. The wire, line, or conductive pathway may be integrated with the probe wire for example enclosed within a plastic or rubber insulating material, or un-integrated. The on-device display device 410 and the off-device display device 490 may display similar or the same data. In the illustration both displays display the illustrative measurement value −0.83 in alphanumeric characters such as numbers.

Figure 5:
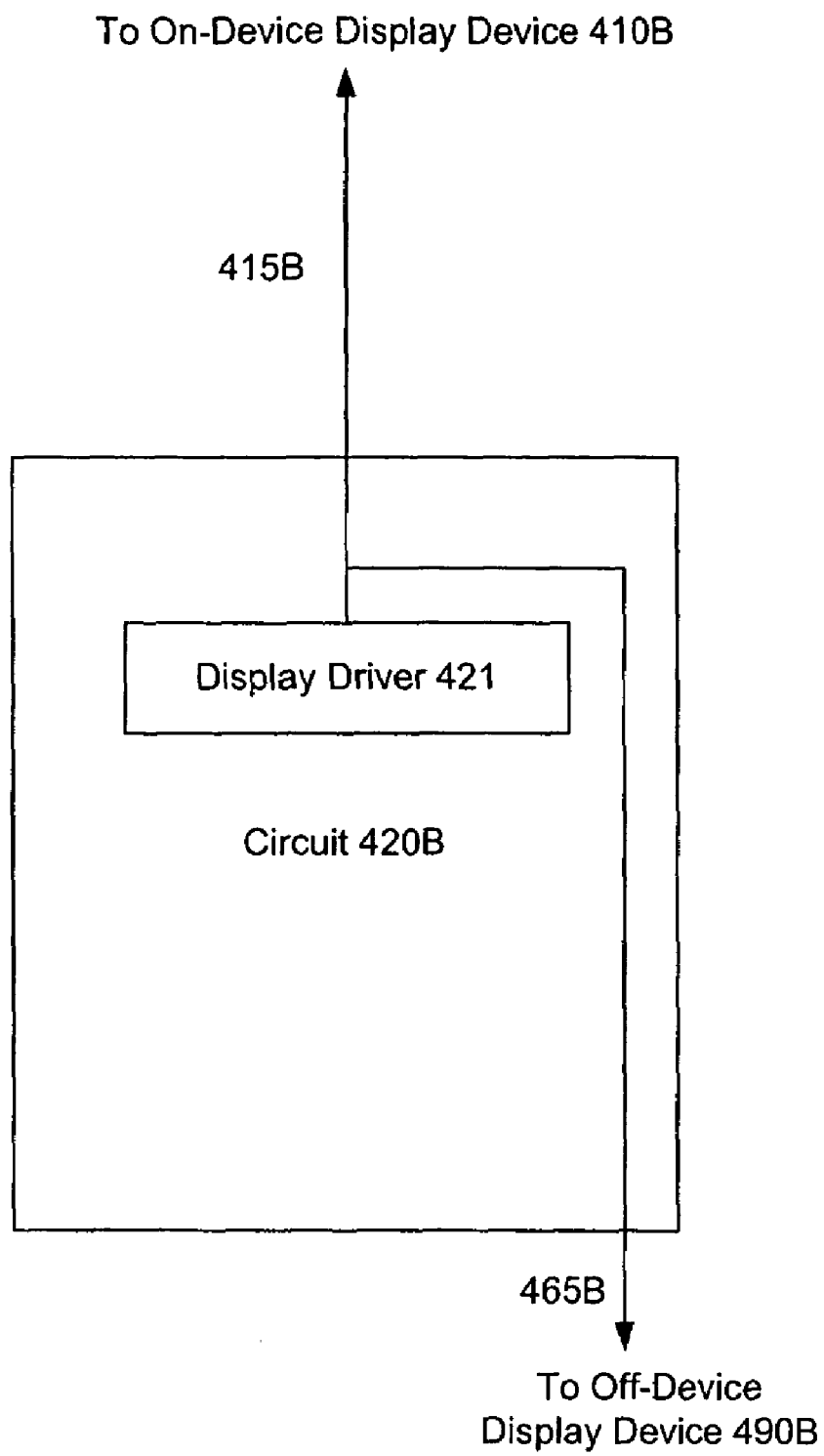
FIG. 5 shows a multimeter circuit containing a display driver to provide a display signal to the on-device display device to provide the display signal to the off-device display device, according to one embodiment of the invention.

FIG. 5 shows a multimeter circuit 420B containing a display driver 421 to provide a display signal 415B to the on-device display device 410B to provide the display signal 465B to the off-device display device 490B, according to one embodiment of the invention. The display signal 465B to the off-device display device 490B may be sampled, tapped, or otherwise derived from the display signal used to generate the display signal 415B provided to the on-device display device 410B.

Figure 6:
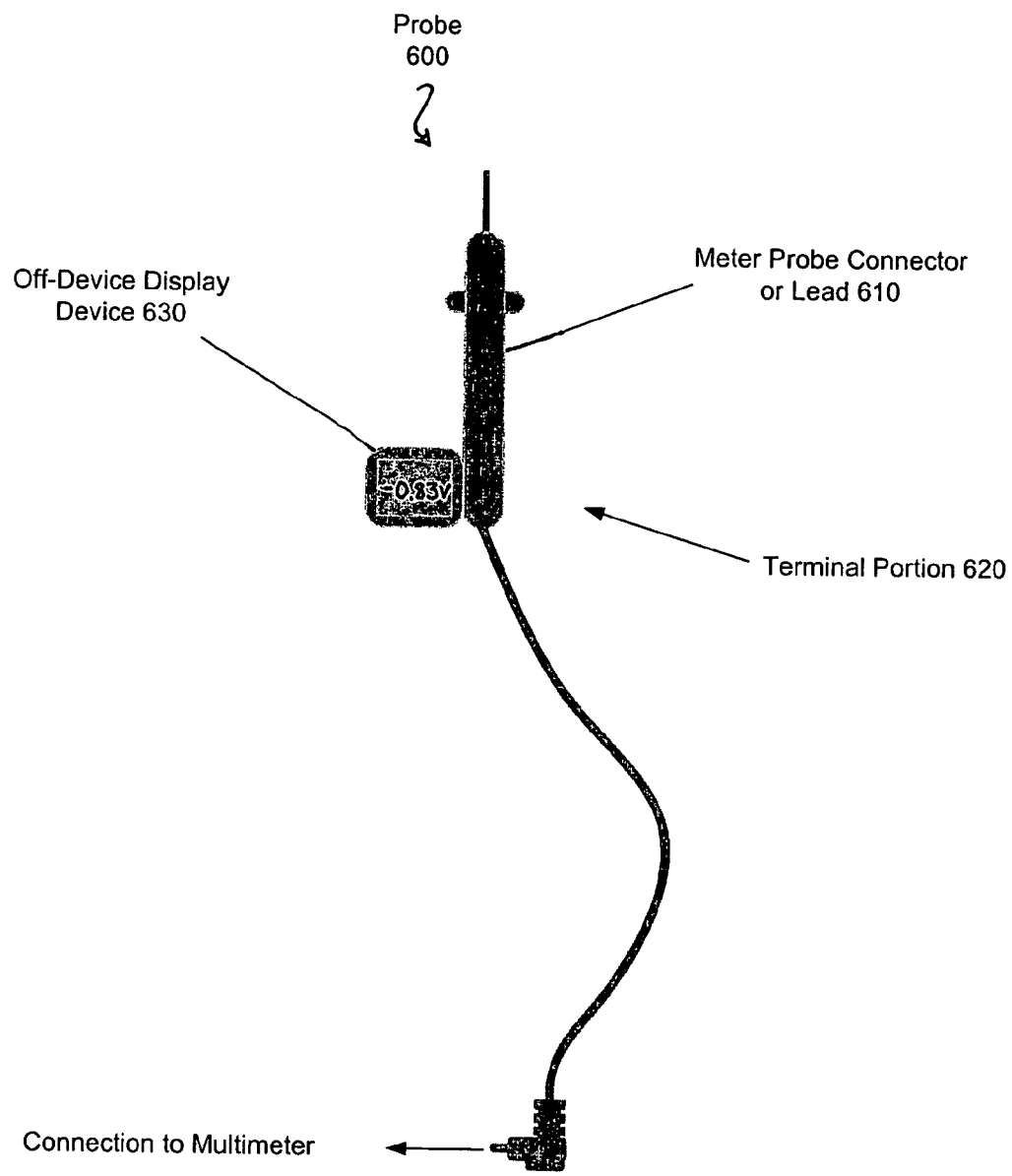
FIG. 6 shows au exemplary probe containing a digital off-device display device attached to a grip of a hand-held test probe connector at a terminal portion of the probe, according to one embodiment of the invention.

FIG. 6 shows an exemplary probe 600 containing a digital off-device display device 630 attached to a grip of a handheld test probe connector 610 at a terminal portion 620 of the probe 600, according to one embodiment of the invention. The display device 630 may be attached to the test probe connector 610 so that a display screen of the display device 630 is oriented for good viewing by the user when properly using the probe to test an electrical system.

Figure 7:
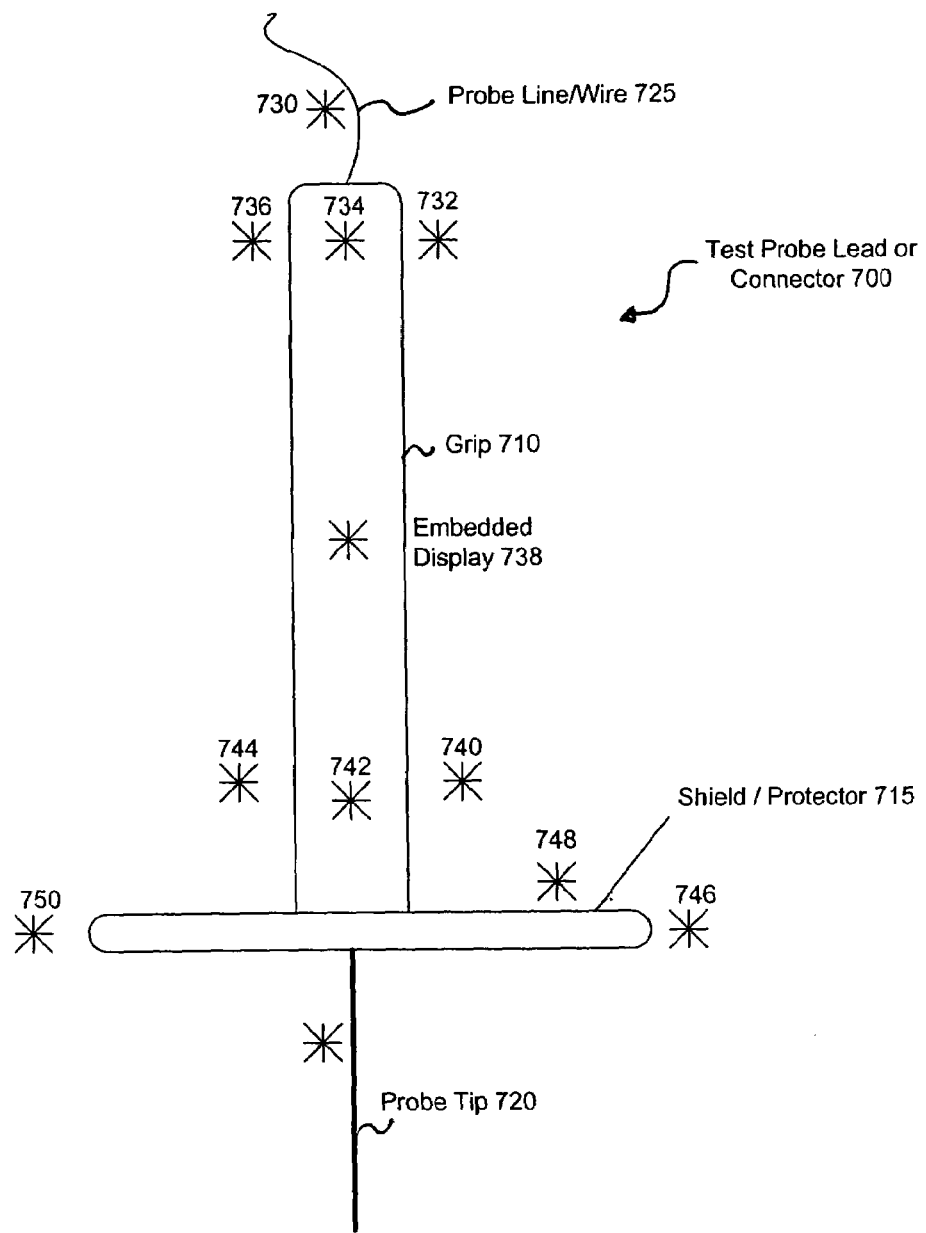
FIG. 7 shows an exemplary test probe lead or connector marked with asterisks at various locations where an off-device display device may be located, according to various embodiments of the invention.

FIG. 7 shows an exemplary test probe lead or connector 700 marked with asterisks at various locations where an off-device display device may be located, according to various embodiments of the invention. As shown the display device may be located on a probe wire 725, at various locations on a grip 710, or on a shield 715. On the grip and shield the display device may be located on a left-hand side when the probe is being used, as in the locations 732, 740, 748, and 746. This may be appropriate for a right-handed person. Alternatively the display device may be located on a left-hand side of the grip or shield. The display device may also be embedded in the grip as indicated at location 738.

Figure 8:
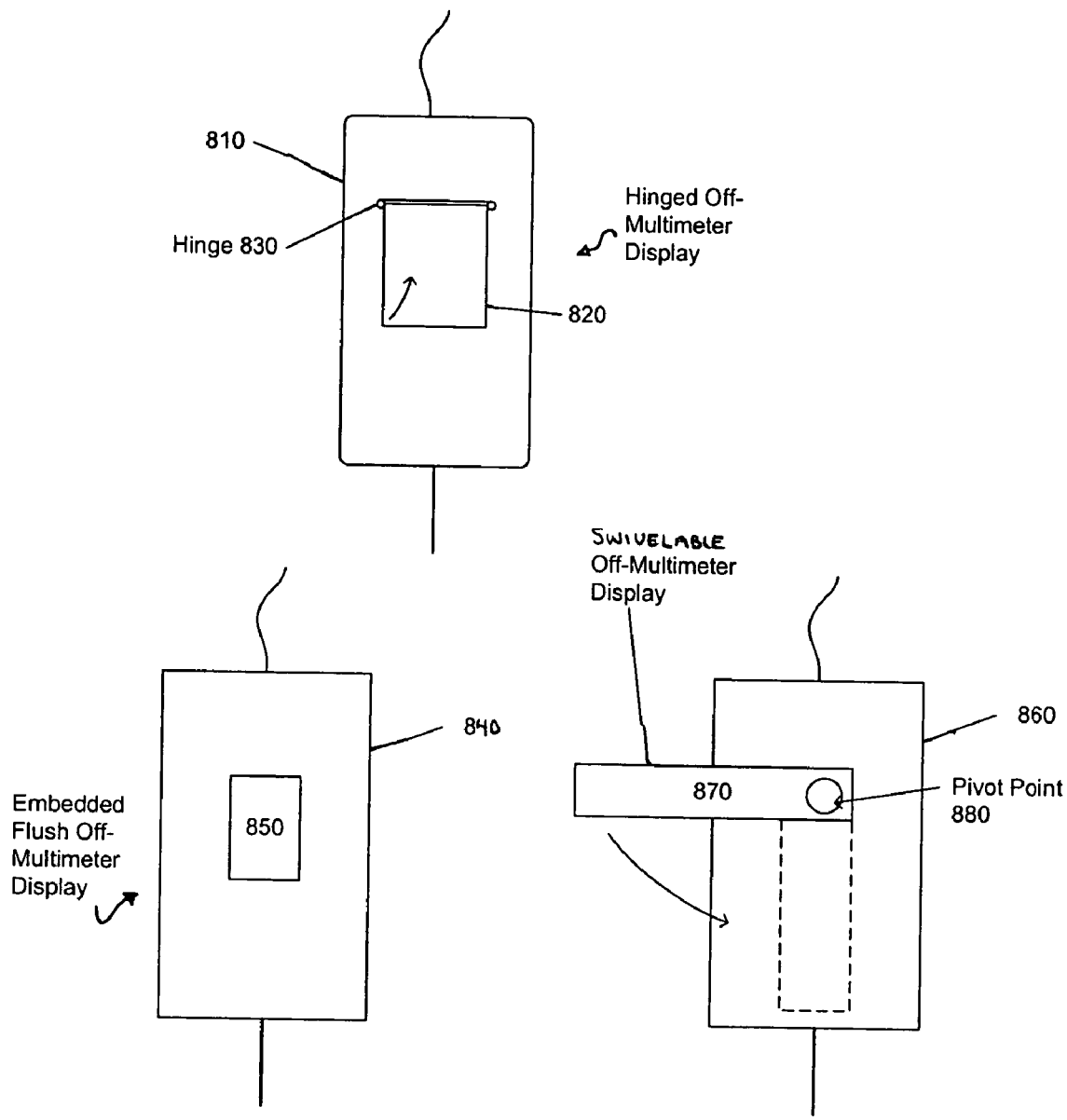
FIG. 8 shows various attachments of off-device display devices with test probe leads, according to various embodiments of the invention.

FIG. 8 shows various attachments of off-device display devices with test probe leads, according to various embodiments of the invention. A first test probe lead 810 having an off-device display device 820 attached to its grip with a hinge 830. The hinge may allow the display device to hingeably move to a convenient viewing angle for the user and move to a seated position to prevent damage, for example during storage, transport, etc. An alternate display device may be attached with a hinge at an opposite end from that shown to allow a display device screen to be visible in one configuration and conceited and protected in another configuration to prevent scratching. Accordingly the off-device display device employed in one embodiment of the invention may be moveable or configurable. A second test probe lead 840 has an off-device display device 850 embedded flush in its grip. A third test probe lead 860 has an off-device display device 870 attached thereto at a single pivot point 880 to swivel or pivot to a convenient viewing angle for the user. This swiveling direction may be appropriate for a left-handed user, for example. Other attachments are contemplated.

Figure 9:
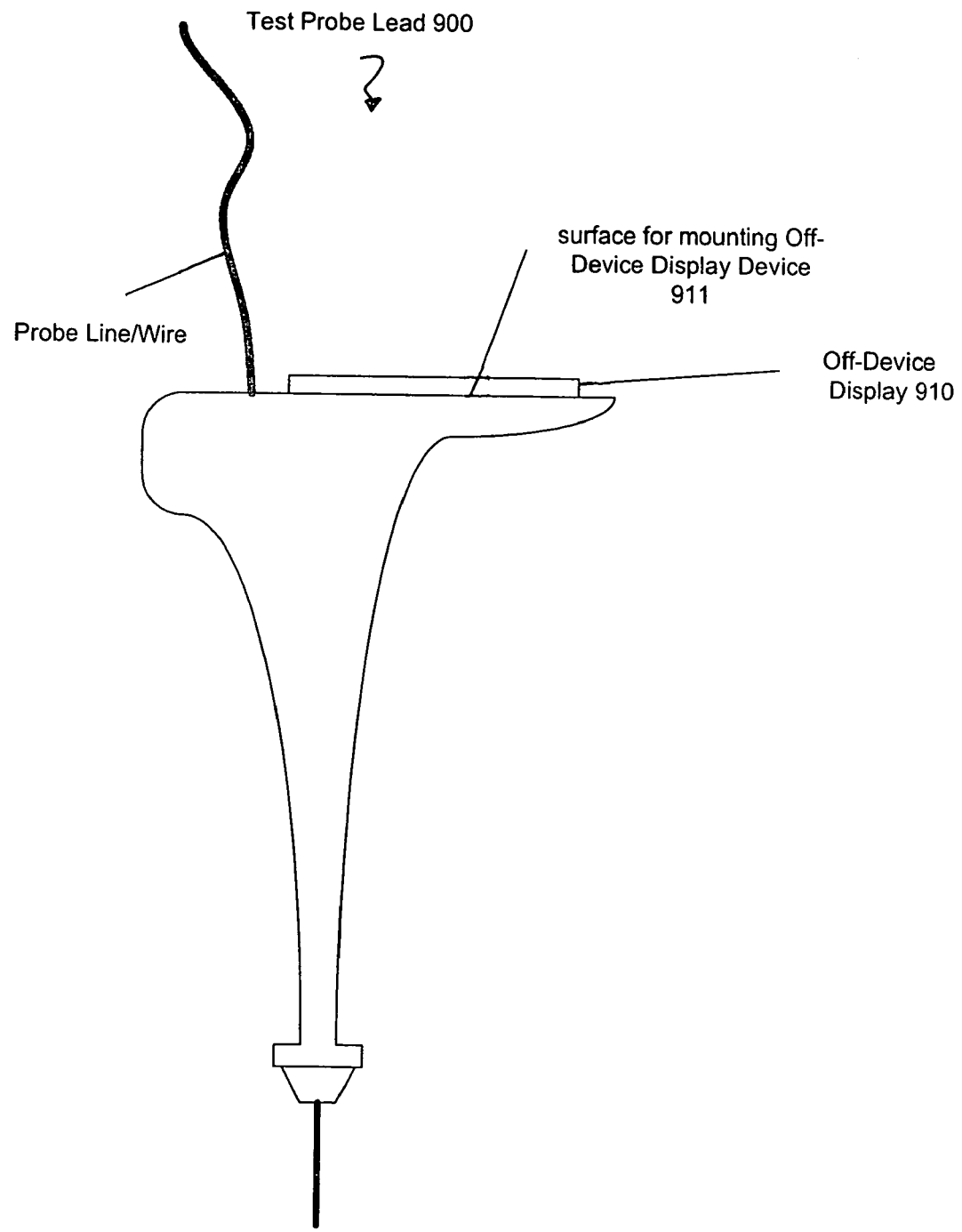
FIG. 9 shows a test probe lead that has been shaped, according to one embodiment of the invention, to provide a surface, in this case at a terminal portion thereof closest to the user when in use, where a display device may be attached.

FIG. 9 shows a test probe lead 900 that has been shaped, according to one embodiment of the invention, to provide a surface 911, in this case at a terminal portion thereof closest to the user when in use, where a display device 910 may be attached. In this case the test probe lead 900 is asymmetrical to accommodate the display device 910 on one side thereof. The off-device display device may contain a cover, such as a cap, to protect the screen from scratches.

The placement of the display device at the end of the connector probe may potentially offer the several advantages. One potential advantage is that the user may hold the terminal portion of the probe, generally the connector or lead, and conveniently view the off-device display device which is located proximate the connector. Another potential advantage is that the user may view measurement data from the display device substantially without needing to turn his head and look away from the electrical device under test where the connector is being employed to an on-device display device. As an example a user may set the multimeter on a supporting surface, or attach it to his person (e.g., a belt), contact the probe leads with a testing system, and read measurement information from an off-multimeter device display without looking at the display device on or incorporated into the multimeter. This may improve overall user safety, particularly when the device under test is a high power, voltage, or current device. This may also prevent a measurement error or damage to the device. Accordingly the off-device display device may potentially allow the user to view the displayed measurement information easier, more ergonomically, and potentially more safely than with conventional multimeters.

Figure 11:
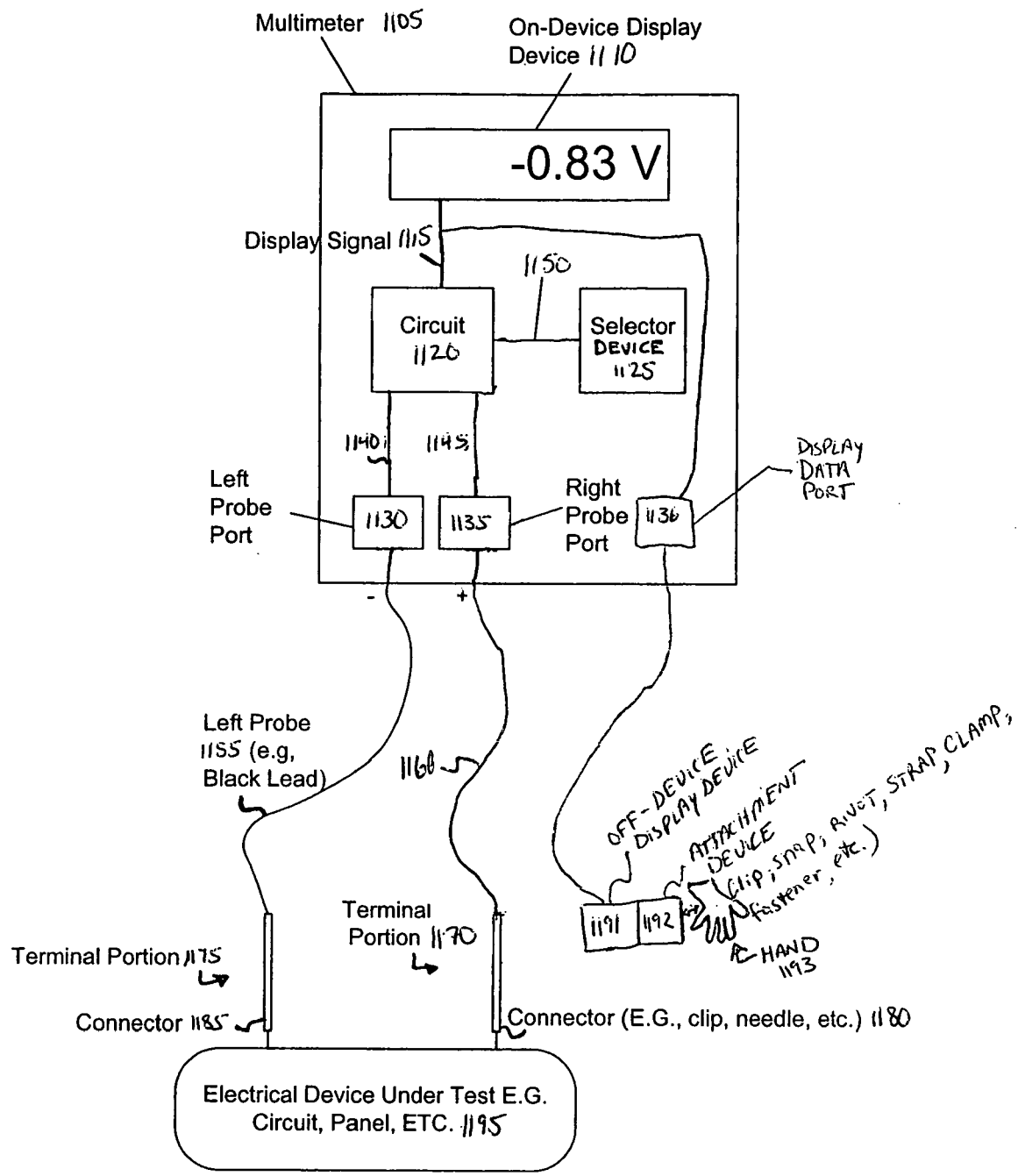
FIG. 11 shows a system including a multimeter, a left probe (e.g., a black lead), a right probe (e.g., a red lead), an off-device display device, an attachment device to attach the off-device display device to a user, for example at a hand, and an electrical device under test, according to one embodiment of the invention.

FIG. 11 shows a system including a multimeter 1105, a left probe 1155 (e.g., a black lead), a right probe 1160 (e.g., a red lead), an off-device display device 1191, an attachment device 1192 to attach the off-device display device to a user, for example at a hand 1193, and an electrical device under test 1195, according to one embodiment of the invention. The off-device display device 1191 is not attached to the terminal portion 1170 of the right probe 1160. Also, the off-device display device has a wire, cable, or other conductive pathway coupled with a display data port 1136 of the multimeter 1105. The wire, cable, or conductive pathway may contain a display data signal that may be tapped or sampled from a display signal 1115, or otherwise derived from the display signal 1115 and provided to the off-device display device 1191. The display device 1191 may be attached to the user with the attachment device 1192. The attachment device may represent a clip, snap, rivot, strap, clamp, buckle, or other fastener to a hand, wrist or other portion of a user, or to a sleeve, glove, or other clothing worn by the user. When attached, and when a probe is in use, the display device 1191 may be proximate a terminal portion of a probe, since the hand generally maneuvers the probe, and may be within 12 inches, or 6 inches, for example. In an alternate embodiment of the invention, the attachment device may attach to the terminal portion of a probe.

II. Off-Multimeter Selector Device

Figure 10:
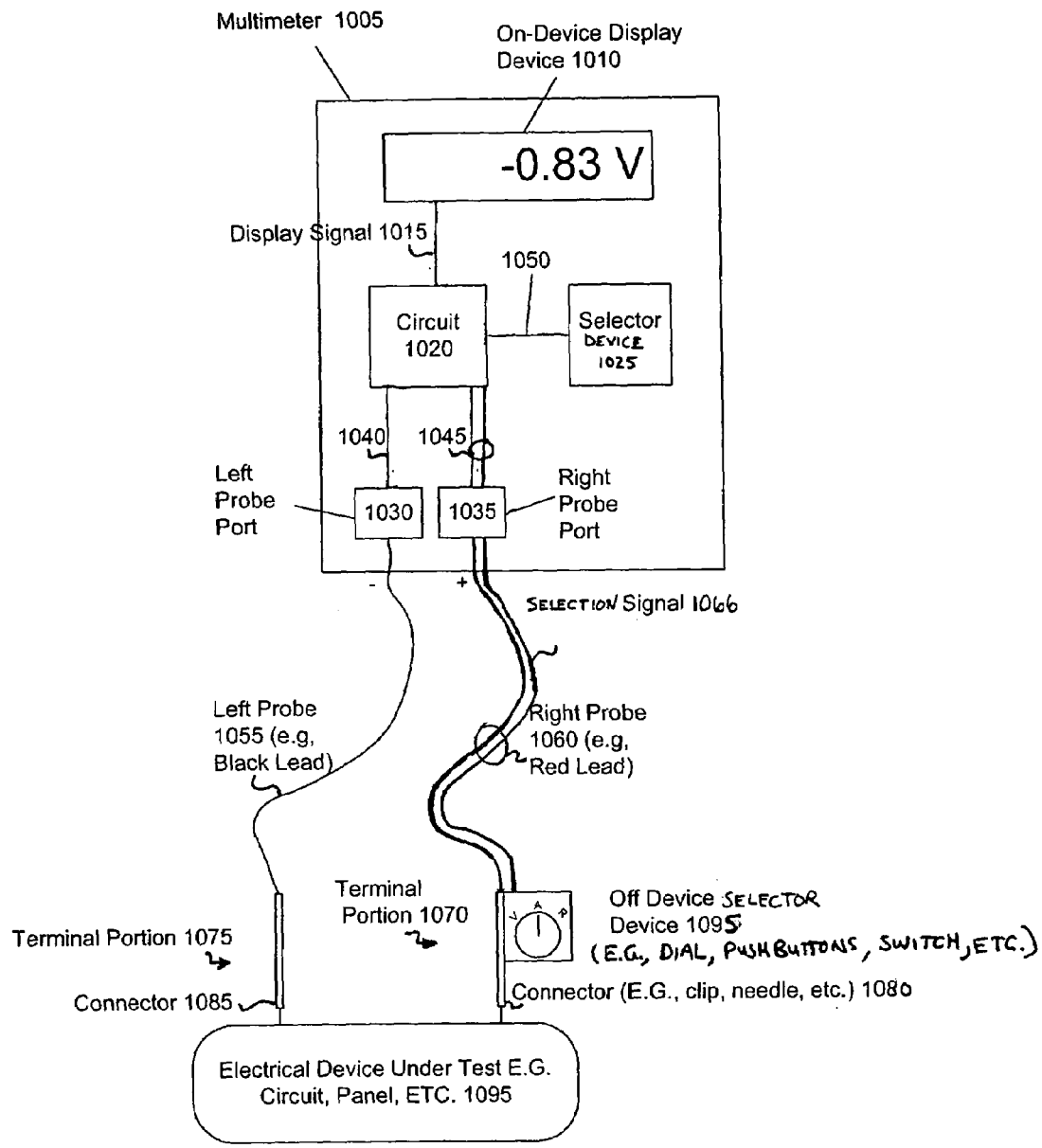
FIG. 10 shows a system including a multimeter, a left probe (e.g., a black lead), a right probe (e.g., a red lead), an off-device selector device, and an electrical device under test, according to one embodiment of the invention.

FIG. 10 shows a system including a multimeter 1005, a left probe 1055 (e.g., a black lead), a right probe 1060 (e.g., a red lead), an off-device selector device 1095, and an electrical device under test 1095, according to one embodiment of the invention. The multimeter 1005 includes an optional on-device selector device 1025 that may include a dial, knob, buttons, switches, or other selector devices known in the arts. The selector device 1025 is coupled with the circuit to provide a selection signal 1050 to the circuit to affect electrical processing by the circuit.

The off-device selector device 1095 is attached to the right probe 1060 at a terminal portion 1070 thereof. The off-device selector device 1095 may include a dial, knob, buttons, switches, or other selector devices known in the art to select a conventional multimeter operation setting, such as the settings illustrated on the dials of the multimeters in FIGS. 2 and 3 (e.g., Off, V, A, R, etc.). In particular the off-device selector device 1095 is attached to a right connector 1080. The right connector 1080 may represent a rigid or semi-rigid plastic or other typically insulating material housing an electrically conductive needle, pin, or crocodile clips. The off-device selector device may be attached using attachment methods and at locations such as those described above for attaching the off-device display device.

Generally in at least one mode of operation the off-device selector device may control at least somewhat an operation of the multimeter. In one embodiment of the invention, the on-device selector device has one configuration or setting, such as a "remote control" setting, that relinquishes selection control to the off-device selector device. When the on-device selector device has this configuration the circuit 1020 understands that processing is to be performed according to selection information from the off-device selection device. The on-device selection device and the off-device selection device may also work in combination. For example, the off-device selection device may control or tune a selection, for example an electrical parameter or range, of the on-device selection device. In another embodiment of the invention, the off-device selector device has one configuration or setting, such as a dial position, that takes control of selection. For example when a dial on the off-device selection device is moved from a "passive" setting the circuit 1020 understands that the off-device control device controls selection.

A selection signal 1066 may be conveyed from the off-device selection device 1095 to the circuit 1020 through the right probe 1060 and right probe port 1035. The right probe 1060 may have a line, wire, or other conductive pathway to receive the signal, transmit the signal, and provide the signal to the right probe port 1035. Likewise, the multimeter may contain a line, wire, or other conductive pathway to receive the signal from the right probe port 1035 and provide the signal to the circuit 1020. The circuit 1020 may receive the selection signal and process the selection signal to generate a display signal for a display device.

III. General Matters

Alternate embodiments of the invention are contemplated. The invention is not limited to multimeters and probes. In an alternate embodiment of the invention an off-device display device may be attached to a terminal portion near a pH meter probe, temperature meter probe, resistance based temperature sensor, etc. Also, it is contemplated that wireless probes may potentially be employed with a probe connector or lead having both an off-device display device and a wireless transceiver. Also, an off-multimeter selector device and off-multimeter display device may be employed on a common probe or on separate probes. As another option, in one embodiment of the invention, an off-multimeter display device or selector device may be detachable and re-attachable to a probe to allow such devices to be exchanged, substituted, or replaced.

In the description above, for the purposes of explanation, numerous specific details are set forth in order to provide a thorough understanding of the present invention. It will be apparent, however, to one skilled in the art that the present invention can be practiced without some of these specific details. In other instances, well-known circuits, structures, devices, and techniques have been shown in block diagram form or without detail in order not to obscure the understanding of this description.

The present invention includes various operations. The operations of the present invention can be performed by hardware components, or can be embodied in machine-executable instructions, which can be used to cause a general-purpose or special-purpose processor or logic circuits programmed with the instructions to perform the steps. Alternatively, the operations can be performed by a combination of hardware and software.

Many of the methods are described in their most basic form, but operations can be added to or deleted from any of the methods and information can be added or subtracted from any of the described messages without departing from the basic scope of the present invention. It will be apparent to those skilled in the art that many further modifications and adaptations can be made. The particular embodiments are not provided to limit the invention but to illustrate it. The scope of the present invention is not to be determined by the specific examples provided above but only by the claims below.

It should also be appreciated that reference throughout this specification to "one embodiment" or "an embodiment" means that a particular feature can be included in the practice of the invention. Similarly, it should be appreciated that in the foregoing description of exemplary embodiments of the invention, various features of the invention are sometimes grouped together in a single embodiment, Figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this invention.

What is claimed is:

1. An apparatus comprising:
    a probe;
    a terminal conductor of the probe to couple with a port of an electrical testing device;
    a wire portion of the probe coupled with the terminal conductor, wherein the wire portion includes a conductive pathway used to carry a display signal integrated with a conductive pathway to carry a probe signal;
    a terminal portion of the probe, the terminal portion including a connector to couple with an electrical system; and
    a display device attached to the probe with a hinge, wherein the hinge allows the display device to hingeably move between a position having a convenient viewing angle for the user and a seated position.

2. The apparatus of claim 1, wherein the display device is non-detachably attached to the probe with the hinge.

3. The apparatus of claim 1, wherein the hinge allows a display of the display device to be concealed in one position.

4. The apparatus of claim 1, wherein the display device is attached to a grip of the probe.

5. The apparatus of claim 1, further comprising a cap to protect a screen of the display device from scratches.

6. An apparatus comprising:
   an electronic testing device;
   a port of the electronic testing device having a common hole to receive a probe signal and provide a display signal;
   a probe attached to the common hole to provide the probe signal and receive the display signal;
   a probe lead of the probe, wherein the probe lead has been asymmetrically shaped to provide a probe attachment surface;
   a display device non-detachably attached to the probe attachment surface,
   wherein the probe attachment surface is at a left-hand side of the probe lead to facilitate viewing of the attached display device by a right-handed user.

7. The apparatus of claim 6, wherein the display device is attached at a terminal portion of the probe lead closest to the user.

8. The apparatus of claim 6, wherein the display device is attached to a grip of the probe.

9. The apparatus of claim 6, further comprising a cap to protect a screen of the display device from scratches.

10. The apparatus of claim 6, wherein the electronic testing device campuses a multimeter.

11. An apparatus comprising:
    an electronic testing device;
    a port of the electronic testing device having a common hole to receive a probe signal and provide a display signal;
    a probe attached to the common hole to provide the probe signal and receive the display signal;
    a probe lead of the probe;
    a display device non-detachably attached to the probe lead,
    wherein the display device is attached at a left-band side of the probe lead to facilitate viewing of the display by a right-handed user.

12. The apparatus of claim 11, wherein the display device is attached to the probe lead with a hinge.

13. The apparatus of claim 11, wherein the display device is attached to the probe lead at a single pivot point.

14. The apparatus of claim 11, wherein the display device is attached to a grip of the probe.

15. The apparatus of claim 11, wherein the display device is attached to a shield of the probe.

16. The apparatus of claim 11, further comprising a cap to protect a screen of the display device from scratches.

17. The apparatus of claim 11, wherein the electronic testing device comprises a multimeter.

18. An apparatus comprising:
    a probe;
    a terminal conductor of the probe to couple with a port of an electrical testing device;
    a wire portion of the probe coupled with the terminal conductor, wherein the wire portion includes a conductive pathway to carry a display signal run in parallel with a conductive pathway to carry a probe signal;
    a terminal portion of the probe, the terminal portion including a connector to couple with an electrical system; and
    a display device non-detachably attached to the probe.

19. The apparatus of claim 18, wherein the display device is attached to the probe with a hinge.

20. The apparatus of claim 18, wherein the hinge allows a display of the display device to be concealed in one position.

21. The apparatus of claim 18, wherein the display device is attached to the probe with a single pivot point.

22. The apparatus of claim 18, wherein the display device is attached to the side of the probe.

23. The apparatus of claim 18, wherein the display device is embedded flush in the probe.

24. The apparatus of claim 18, wherein the display device is attached to a grip of the probe.

25. The apparatus of claim 18, further comprising a cap to protect a screen of the display device from scratches.

* * * * *